(12) United States Patent
Takahashi

(10) Patent No.: US 9,391,103 B2
(45) Date of Patent: Jul. 12, 2016

(54) IMAGE PICKUP ELEMENT AND IMAGE PICKUP DEVICE

(71) Applicant: Sony Corporation, Tokyo (JP)

(72) Inventor: Hirotsugu Takahashi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/341,476

(22) Filed: Jul. 25, 2014

(65) Prior Publication Data

US 2015/0048473 A1    Feb. 19, 2015

(30) Foreign Application Priority Data

Aug. 15, 2013  (JP) .................................. 2013-168930

(51) Int. Cl.
*H01L 31/00* (2006.01)
*H01L 27/146* (2006.01)

(52) U.S. Cl.
CPC ........ *H01L 27/1461* (2013.01); *H01L 27/1464* (2013.01); *H01L 27/14621* (2013.01); *H01L 27/14623* (2013.01); *H01L 27/14627* (2013.01)

(58) Field of Classification Search
CPC ..................... H01L 27/1461; H01L 27/14621; H01L 27/14623; H01L 27/14627; H01L 27/1464; H01L 31/0322; H01L 27/14636

USPC .................................. 257/431–432, 435, 443
See application file for complete search history.

(56) References Cited

U.S. PATENT DOCUMENTS

| | | | | |
|---|---|---|---|---|
| 2011/0187912 A1* | 8/2011 | Arayashiki et al. | ........... | 348/308 |
| 2011/0242376 A1* | 10/2011 | Ando | ........................... | 348/294 |
| 2012/0188397 A1* | 7/2012 | Ohta | ........................ | 348/222.1 |

FOREIGN PATENT DOCUMENTS

| | | |
|---|---|---|
| JP | 2007-123721 | 5/2007 |
| JP | 2008-093834 | 8/2008 |
| JP | 2009-078299 | 6/2009 |
| JP | 2012-004443 | 1/2012 |
| WO | WO 2008/093834 A9 | 8/2008 |
| WO | WO 2009/078299 A1 | 6/2009 |

* cited by examiner

*Primary Examiner* — Thanh T Nguyen
(74) *Attorney, Agent, or Firm* — Dentons US LLP

(57) ABSTRACT

An image pickup element includes: a photoelectric conversion film provided on a semiconductor substrate and including a chalcopyrite-based compound; an insulating film provided on a light incident surface side of the photoelectric conversion film; and a conductive film provided on the insulating film.

12 Claims, 9 Drawing Sheets

IMAGE PICKUP ELEMENT AND IMAGE PICKUP DEVICE

CROSS REFERENCE TO RELATED APPLICATIONS

This application claims the benefit of Japanese Priority Patent Application JP2013-168930 filed Aug. 15, 2013, the entire contents of which are incorporated herein by reference.

BACKGROUND

The present disclosure relates to an image pickup element having a photoelectric conversion section including a chalcopyrite-based compound, and to an image pickup device including the image pickup element.

For a solid-state image pickup device such as a charge coupled device (CCD) image sensor and a complementary metal oxide semiconductor (CMOS) image sensor, a reduction in pixel size is desired, as the number of pixels increases. Meanwhile, there is a demand for improvement in moving image properties through high-speed image pickup. In such reduction in pixel size and high-speed image pickup, the number of photons entering a unit pixel (a solid-state image pickup element) decreases, which reduces sensitivity (a signal-to-noise (S/N) ratio). Further, for example, an image-taking function in a dark place may be demanded of a monitoring camera. Therefore, an image pickup device that achieves high sensitivity, in addition to an increase in the number of pixels and a reduction in pixel size, is desired.

For example, in photoelectric conversion devices (solid-state image pickup devices) of Japanese Unexamined Patent Application Publication No. 2007-123721, and International Publication Nos. WO 2008/093834, and WO 2009/078299, sensitivity is increased using a chalcopyrite-based compound semiconductor having a high optical-absorption coefficient, for a photoelectric conversion film. These photoelectric conversion devices have a configuration in which a photoelectric conversion film is interposed between an n-type semiconductor disposed on incident-light side, and a lower electrode disposed on a side opposite to the incident-light side. These photoelectric conversion devices have such a structure that, of an electron-hole pair generated by photoelectric conversion, the electron is discharged to the n-type semiconductor, while the positive hole is transferred by the lower electrode and then read out in a silicon circuit.

In the photoelectric conversion devices having such a structure, electric charge (the positive hole) generated by the photoelectric conversion during exposure time is stored in a capacitor through the lower electrode. Therefore, removal of kTC noise (thermal noise) in reset operation is difficult, which may degrade image quality. To address this situation, for example, in a solid-state image pickup device of Japanese Unexamined Patent Application Publication No. 2012-4443 (JP2012-4443A), a photoelectric conversion film made of a chalcopyrite-based compound semiconductor is provided on a Si substrate where an n-type semiconductor region is formed. Further, an upper electrode is disposed on an incident surface side of this photoelectric conversion film. In this solid-state image pickup device, of an electron-hole pair generated by photoelectric conversion, the positive hole is discharged to the upper electrode, while the electron is stored in a junction capacitor through the depleted n-type semiconductor. As a result, the kTC noise is removed.

SUMMARY

However, in the configuration using the chalcopyrite-based compound semiconductor for the photoelectric conversion film as employed by the solid-state image pickup device discussed in JP2012-4443A, there is such a disadvantage that it is difficult to control a thickness of the depletion layer. This is because, for the chalcopyrite-based compound semiconductor, it is difficult to control acceptor concentration and donor concentration by a method such as ion implantation. When the photoelectric conversion film is depleted excessively, the depletion layer comes into contact with an interface of the upper electrode, which may lead to generation of a dark current. However, when the depletion does not extend to a region where the photoelectric conversion occurs, a drift component of electric charge generated by the photoelectric conversion is decreased, which reduces the sensitivity. In particular, since the chalcopyrite-based compound semiconductor has a high optical-absorption coefficient, the region necessary for the photoelectric conversion is small and therefore, it is considerably important to control the depletion layer.

It is desirable to provide an image pickup element capable of suppressing thermal noise and a dark current without reducing sensitivity, and an image pickup device including the image pickup element.

According to an embodiment of the present technology, there is provided an image pickup element including: a photoelectric conversion film provided on a semiconductor substrate and including a chalcopyrite-based compound; an insulating film provided on a light incident surface side of the photoelectric conversion film; and a conductive film provided on the insulating film.

In the image pickup element according to the above-described embodiment of the present technology, the insulating film and the conductive film are formed in this order on the photoelectric conversion film including the chalcopyrite-based compound. Therefore, a voltage of an upper electrode (here, the conductive film) is allowed to be arbitrarily controlled, which allows control of a width and a thickness of a depletion layer formed in the photoelectric conversion film.

According to an embodiment of the present technology, there is provided an image pickup device provided with an image pickup element, the element including: a photoelectric conversion film provided on a semiconductor substrate and including a chalcopyrite-based compound; an insulating film provided on a light incident surface side of the photoelectric conversion film; and a conductive film provided on the insulating film.

According to the image pickup element and the image pickup device of the above-described embodiments of the present technology, the insulating film and the conductive film are formed on the photoelectric conversion film. Therefore, the width and the thickness of the depletion layer formed in the photoelectric conversion film are allowed to be controlled by arbitrarily controlling the voltage of the conductive film. Accordingly, both thermal noise and a dark current are allowed to be suppressed.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present technology, and are incorporated in and constitute a part of this specification. The drawings illustrate embodiments and, together with the specification, serve to describe the principles of the technology.

DETAILED DESCRIPTION

An embodiment of the present technology will be described below in detail with reference to the drawings. It is to be noted that the description will be provided in the following order.
1. Embodiment (an example in which an insulating film and a conductive film are provided on a photoelectric conversion film)
2. Modification 1 (an example in which the conductive film is divided between a photoelectric conversion section and an ineffective section)
3. Modification 2 (an example in which light blocking characteristics are added to the conductive film on the ineffective section)
4. Modification 3 (an example in which a projection is formed in the conductive film on the ineffective section)
5. Application example (an image pickup device)

1. Embodiment (Configuration of Image Pickup Element 10)

Figure 1:
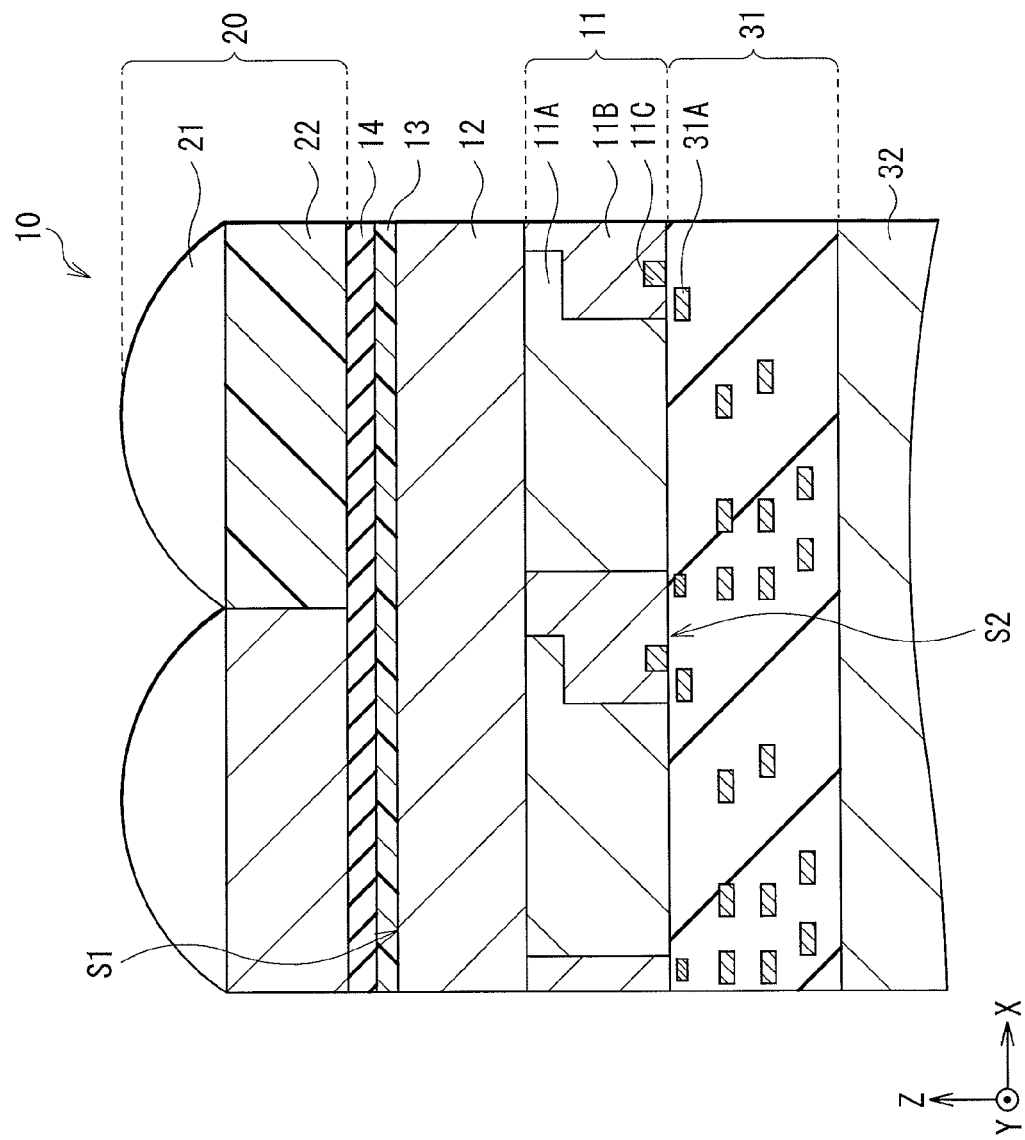
FIG. 1 is a cross-sectional diagram illustrating a schematic configuration of an image pickup element according to an embodiment of the present technology.

FIG. 1 illustrates a cross-sectional configuration of an image pickup element (an image pickup element 10) according to an embodiment of the present technology. The image pickup element 10 may form, for example, one pixel (for example, a pixel P), in an image pickup device (for example, an image pickup device 1) such as a CCD image sensor or a CMOS image sensor (see FIG. 8 for the pixel P and the image pickup device 1). The image pickup element 10 is of a backside illumination type. The image pickup element 10 has a configuration in which a condensing section 20 and a photoelectric conversion film 12 are provided on a light incident surface side of a semiconductor substrate 11. Further, a multilayered wiring layer 31 is provided on a surface (a surface S2) of the semiconductor substrate 11, the surface being opposite to the light incident surface side.

In the present embodiment, in the image pickup element 10, for example, the photoelectric conversion film 12 of a p-type may be provided on the semiconductor substrate 11 having an n-type region 11A (an n-type well) and a p-type region 11B (a p-type well). The photoelectric conversion film 12 is formed of a chalcopyrite-based compound semiconductor (hereinafter simply referred to as the chalcopyrite-based compound). Of the photoelectric conversion film 12, a surface being on a light incident surface side is a light-receiving surface (a surface S1). An insulating film 13 and a conductive film 14 are provided in this order on the photoelectric conversion film 12. Thus, a so-called metal-insulator-semiconductor (MIS) structure is configured.

The semiconductor substrate 11 may be configured of, for example, a silicon (Si) substrate, in which the n-type region 11A and the p-type region 11B are provided as described above. The n-type region 11A serves as a storage section that stores electric charge caused by photoelectric conversion in a photoelectric conversion section 12A (see FIG. 2) of the photoelectric conversion film 12. In the p-type region 11B, an n-type floating diffusion (FD) 11C is provided in proximity to a back surface (the surface S2). The n-type region 11A and the FD 11C serve as a source-drain, and form an n-channel MOS transistor (a transfer transistor Tr1), together with a gate electrode (wiring) 31A formed in the multilayered wiring layer 31 to be described later.

Besides the above-described transfer transistor Tr1, for example, components such as a reset transistor, an amplifying transistor, and a select transistor may be provided in proximity to the surface S2 of the semiconductor substrate 11. Such transistors may each be, for example, a metal oxide semiconductor field effect transistor (MOSEFT), and included in a circuit for each of the pixels P. Each of the circuits may have, for example, a three-transistor configuration including a transfer transistor, a reset transistor, and an amplifying transistor, or may have a four-transistor configuration including a select transistor in addition to these three transistors. The transistors except the transfer transistor may be shared by the pixels.

The photoelectric conversion film 12 is formed of a chalcopyrite-based compound of p-type having a high optical-absorption coefficient, and is configured to have a band gap wider than a band gap of the semiconductor substrate 11. This allows compatibility between a high optical absorption property and low thermal noise. Examples of the chalcopyrite-based compound may include I-III-VI$_2$ group semiconductors and I-IV-V$_2$ group semiconductors. However, the I-III-VI$_2$ group semiconductors having a wider band gap may be preferably used for the photoelectric conversion film in the present embodiment. Examples of the I-III-VI$_2$ group semiconductors may include Copper Indium Gallium Selenium (Cu—In—Ga—Se, or CIGS), Copper Indium Gallium Sulfur Selenium (Cu—In—Ga—S—Se, or CIGSS), and Copper Indium Sulfur (Cu—In—S, or CIS). It is to be noted that the photoelectric conversion film 12 has a region (the photoelectric conversion section 12A) contributing to the photoelectric conversion and a region (an ineffective section 12B) not contributing to the photoelectric conversion.

The photoelectric conversion section 12A may be, for example, at a position corresponding to the n-type region 11A of the semiconductor substrate 11. Specifically, the photoelectric conversion section 12A may correspond to a part of the photoelectric conversion film 12, the part being on the n-type region 11A. In the photoelectric conversion section 12A, a pn junction is formed by contact with the n-type region 11A of the semiconductor substrate 11, and a depletion layer D (see FIG. 2) is formed in the photoelectric conversion section 12A by application of a reverse bias between the n-type region 11A and the p-type region 11B. Light that has entered the light-receiving surface (the surface S1) of the photoelectric conversion section 12A generates an electron-hole pair through the photoelectric conversion. Either the electron or the positive hole of this pair is transferred to a vertical signal line Lsig (see FIG. 8) as signal charge, through the above-described transfer transistor Tr1. It is to be noted that the signal charge may be either the electron or the positive hole generated by the photoelectric conversion. Here, a case of reading out the electron as the signal charge will be described as an example.

The insulating film 13 may be configured of, for example, a single layer film of any of silicon nitride ($Si_2N_3$), silicon oxide ($SiO_2$), silicon oxynitride (SiON), and the like, or a laminated film of any of these materials. The insulating film 13 may have a thickness of, for example, 5 nm or more and 500 nm or less.

The conductive film 14 serves as an upper electrode in the image pickup element 10, and is provided on the light-receiving surface Si side of the photoelectric conversion film 12. The conductive film 14 is formed of a transparent conductive material having optical transparency. The transparent conductive material may be, for example, any of indium tin oxide (ITO), indium zinc oxide (IZO), zinc oxide (ZnO), indium tin zinc oxide (InSnZnO ($\alpha$-ITZO)), and an alloy of aluminum (Al) and zinc oxide (ZnO). The conductive film 14A applies a bias to the photoelectric conversion film 12 so that, for example, a valence band Ev of a part of the photoelectric conversion film 12, the part being on the p-type region 11B of the semiconductor substrate 11, namely, the ineffective section 12B, becomes flat (see Part (B) of FIG. 3). The conductive film 14 may have a thickness of, for example, 50 nm or more and 200 nm or less.

On the conductive film 14, for example, an on-chip lens 21 and a color filter 22 may be provided as the condensing section 20.

The on-chip lens 21 has a function of condensing light towards the photoelectric conversion film 12 (in particular, the photoelectric conversion section 12A). The on-chip lens 21 has a lens diameter set at a value suitable for the size of the pixel P, which may be, for example, 0.9 μm or more and 3 μm or less. Further, for example, the on-chip lens 21 may have a refractive index of, for example, 1.1 to 1.4. Examples of a lens material may include a silicon oxide film ($SiO_2$). In the image pickup element 10 of the backside illumination type, a distance between the on-chip lens 21 and the light-receiving surface (the surface S1) of the photoelectric conversion film 12 is short. Therefore, variations in sensitivity of each color that occurs depending on an F-number of the on-chip lens 21 are suppressed.

The color filter 22 is provided between the on-chip lens 21 and the conductive film 14. For example, any of a red (R) filter, a green (G) filter, a blue (B) filter, and a white (W) filter may be disposed for each of the pixels P. These color filters 22 are provided in a regular color array (for example, a Bayer array). In the image pickup element 10, light receiving data of colors corresponding to the color array is obtained by providing the above-described color filter 22. It is to be noted that the color filter 22 may be omitted as appropriate. Further, a flattening film may be provided between the conductive film 14 and the color filter 22.

The multilayered wiring layer 31 is provided in contact with the surface (the surface S2) of the semiconductor substrate 11, as described above. The multilayered wiring layer 31 includes the plurality of wirings 31A in an interlayer insulating film 31B. The multilayered wiring layer 31 may be, for example, adhered to a supporting substrate 32 made of Si.

The multilayered wiring layer 31 is disposed between the supporting substrate 32 and the semiconductor substrate 11.

The image pickup element 10 as described above may be manufactured as follows, for example.

(Manufacturing Method)

First, the semiconductor substrate 11 including various transistors and peripheral circuits are formed. For the semiconductor substrate 11, for example, a Si substrate may be used. In proximity to the surface (the surface S2) of the Si substrate, the transistors such as the transfer transistor Tr1 and the peripheral circuits such as a logic circuit (CMOS wiring) are provided. Next, the multilayered wiring layer 31 is formed on the surface S2 of the semiconductor substrate 11. In the multilayered wiring layer 31, the plurality of wirings 31A are formed in the interlayer insulating film 31B, and then the supporting substrate 32 is adhered to the multilayered wiring layer 31. Subsequently, an impurity semiconductor region is formed by ion implantation to a back surface side of the Si substrate. Specifically, an n-type semiconductor region is formed at a position corresponding to each of the pixels P, and a p-type semiconductor region is formed between the pixels P.

Next, the back surface of the Si substrate is exposed by polishing or wet etching, and then, for example, a $SiO_2$ film having a thickness of, for example, 100 nm may be formed on this back surface. Subsequently, a part of the $SiO_2$ film, the part being at a position corresponding to a pixel section 1a (see FIG. 8), is removed by photolithography and wet etching. Next, for example, a CIGSSe film having a thickness of, for example, 1,000 nm may be formed using, for example, vacuum deposition or sputtering. Subsequently, patterning for removal of an unnecessary part of the CIGSSe film, the unnecessary part being formed in a region except the pixel section 1a, is performed by photolithography. This unnecessary part of the CIGSSe film is then removed by wet etching or dry etching. In this process, the CIGSSe film may be removed while leaving the $SiO_2$ film, by using, for example, bromine-methanol (Br-methanol) solution or aqua regia.

Next, on the photoelectric conversion film 12, the insulating film 13 made of a material such as $SiO_2$ may be formed to have a thickness of, for example, 5 nm. Subsequently, a through-hole (not illustrated) used to connect the upper electrode (the conductive film 14) to the CMOS wiring formed in the multilayered wiring layer 31 is formed by photolithography and wet etching. Next, a metal film to become the upper electrode may be formed to have a thickness of, for example, 100 nm. The metal film is then patterned by photolithography and wet etching, so that the conductive film 14 is formed.

Finally, a flattening film (not illustrated) made of, for example, a SiN film, the color filter 22, and the on-chip lens 21 are formed on the conductive film 14. The image pickup element 10 is thus completed.

(Operation of Image Pickup Element)

In the image pickup element 10 as described above, signal charge (an electron) may be obtained in the pixel P of the image pickup device 1 as follows, for example. Upon entering the image pickup element 10 through the on-chip lens 21, light L passes through the color filter 22 and the like and then is detected (absorbed) by the photoelectric conversion section 12A in each of the pixels P, so that red, green, or blue color light is photoelectrically converted. Of an electron-hole pair generated in the photoelectric conversion section 12A, the electron moves as the signal charge to the semiconductor substrate 11, specifically, to the n-type region 11A in the Si substrate, for example, to be stored. Meanwhile, the positive hole moves to the p-type region 11B to be discharged.

In the image pickup element 10, a predetermined negative potential VL (<0 V) is applied to the semiconductor substrate 11, while, for example, an electric potential VU (<VL) lower than the electric potential VL may be applied to the conductive film 14. Therefore, in a charge storage state (an OFF state of each of the reset transistor (not illustrated) and the transfer transistor Tr1), the electron of the electron-hole pair generated in the photoelectric conversion film 12 is guided to the n-type semiconductor region of the semiconductor substrate 11 whose potential is relatively high. The electron is extracted from this n-type semiconductor region and then stored in an electrical storage layer (not illustrated) through a transmission path. When the electron is stored, the electric potential VL of the n-type semiconductor region conducted with the electrical storage layer varies. This variation of the electric potential VL corresponds to a signal potential.

In reading operation, the transfer transistor Tr1 changes to an ON state, and the electron stored in the electrical storage layer is transferred to the FD 11C. As a result, a signal based on an amount of the received light L may be read out to the vertical signal line Lsig through a pixel transistor (not illustrated), for example. Subsequently, the reset transistor and the transfer transistor Tr1 change to the ON state, so that the n-type semiconductor region and the FD 11C may be reset, for example, to a power supply voltage VDD.

(Functions and Effects)

As described above, a larger number of pixels and higher sensitivity are demanded of the image pickup device, but to achieve these, reducing the pixel size is necessary. However, when the pixel size is reduced, it is difficult to receive a sufficient amount of light in each pixel. Further, in general, in semiconductors, an optical absorption property is high when a band gap is narrow, while thermal noise is low when a band gap is wide. That is, thermal noise is high when a band gap is narrow, while an optical absorption property is low when a band gap is wide. In other words, the thermal noise and the optical absorption property are in a trade-off relationship.

Therefore, it is conceivable to improve the optical absorption property while reducing the thermal noise, by using a chalcopyrite-based compound semiconductor having a high optical absorption property and a wide band gap, for the photoelectric conversion section. However, as for the chalcopyrite-based compound, density adjustment by a method such as ion implantation is difficult and therefore, it has been difficult to control the width of the depletion layer.

Figure 2:
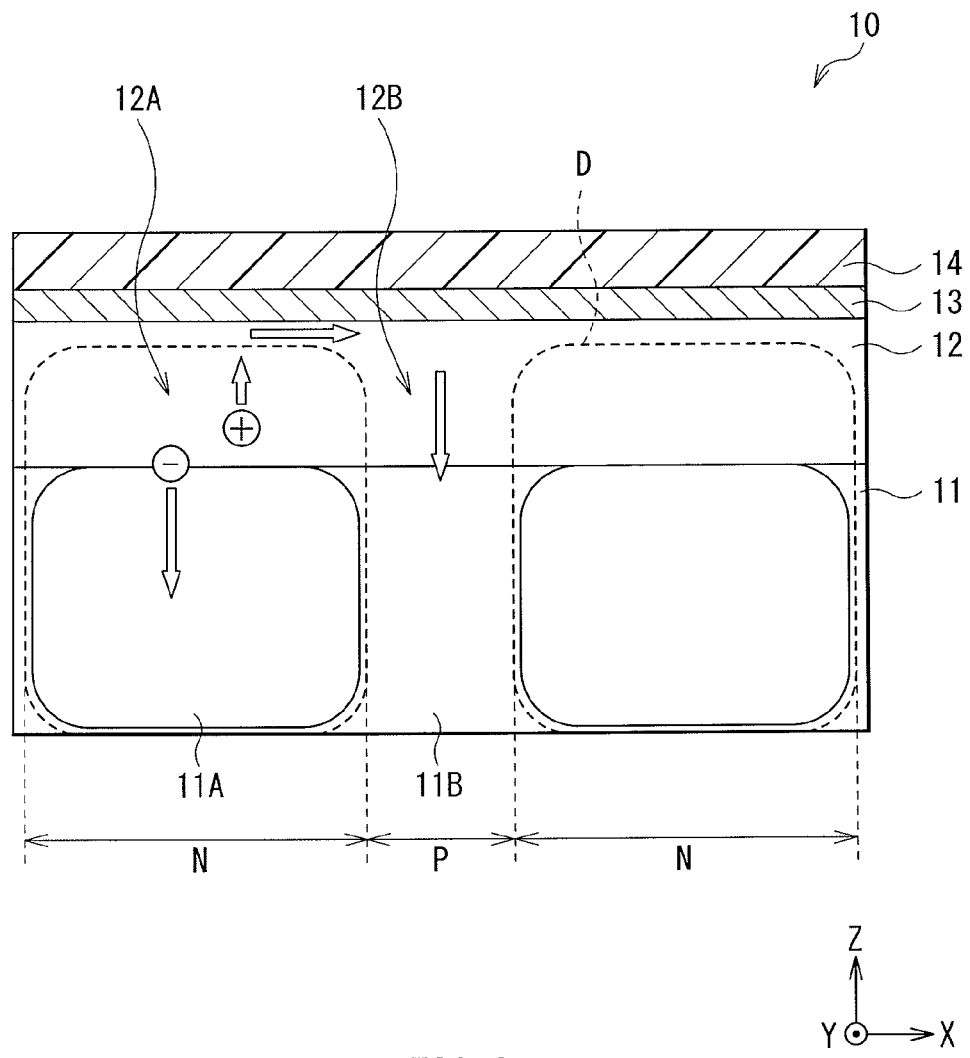
FIG. 2 is a schematic diagram used to describe movement of electric charge in the image pickup element illustrated in FIG. 1.
Figure 3:
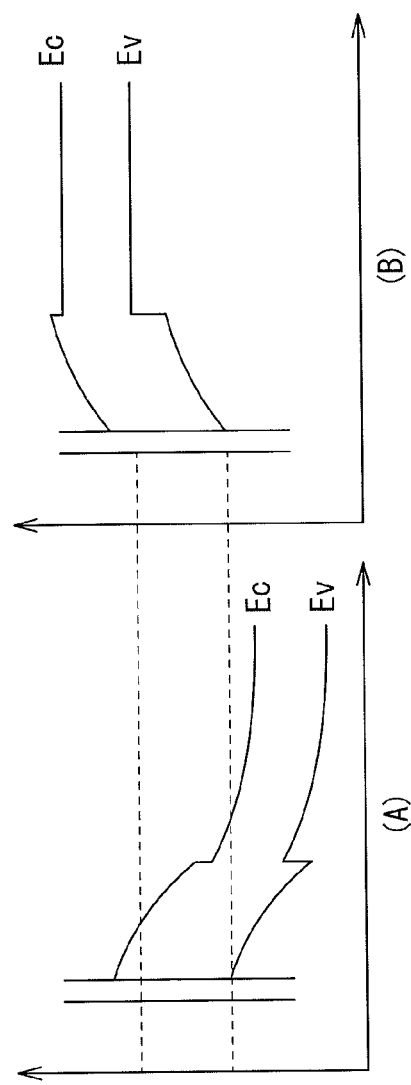
FIG. 3 is an energy band diagram in each region when a negative voltage is applied to the image pickup element illustrated in FIG. 1.

FIG. 2 schematically illustrates movement of electric charge of the image pickup element 10 in the present embodiment. FIG. 3 is a characteristic diagram illustrating an energy band in each of a photoelectric conversion region N (Part (A) of FIG. 3) and an ineffective region P (Part (B) of FIG. 3) when a negative voltage is applied to the conductive film 14. In the image pickup element 10 of the present embodiment, the bias is applied to the conductive film 14 so that the valence band Ev of the ineffective section 12B becomes flat. For this reason, a conduction band Ec of the photoelectric conversion section 12A on the n-type region 11A of the semiconductor substrate 11 has a slant as illustrated in Part (A) of FIG. 3, only by a difference between the n-type region 11A and the p-type region 11B in terms of Fermi level. Further, as illustrated in FIG. 3, the conduction band Ec of the photoelectric conversion film 12 is low at the photoelectric conversion section 12A on the n-type region 11A (Part (A) of FIG. 3), while being high at the ineffective section 12B on the p-type region 11B (Part (B) of FIG. 3). Therefore, the photoelectric conversion film 12 has an electronic wall between the pixels. When the photoelectric conversion film 12 is irradiated with light in this state, an electron generated by photoelectric conversion in the photoelectric conversion section 12A is transferred to the n-type region 11A of the semiconductor substrate 11 through the conduction band Ec of the photoelectric conversion section 12A depleted as illustrated in Part (A) of FIG. 3. On the other hand, a positive hole generated by the photoelectric conversion is discharged through the valence band Ev of the photoelectric conversion section 12A to the p-type region 11B of the semiconductor substrate 11 as illustrated in Part (B) of FIG. 3.

Moreover, since the positive hole is stored between the photoelectric conversion film 12 and the insulating film 13, generation of a dark current is suppressed.

In this way, in the image pickup element 10 of the present embodiment, it is possible to control the thickness of the depletion layer D of the photoelectric conversion film 12, without forming distribution of acceptor concentration by a method such as ion implantation to the photoelectric conversion film 12 configured of the chalcopyrite-based compound. In addition, it is also possible to control a transfer path of an electron and a discharge path of a positive hole.

As described above, in the present embodiment, the insulating film 13 and the conductive film 14 are formed on the photoelectric conversion film 12. Therefore, it is possible to control the thickness of the depletion layer D formed in the photoelectric conversion film 12, as well as the transfer path and the discharge path of the electric charge, by arbitrarily controlling the voltage of the conductive film 14. Accordingly, it is possible to provide the image pickup device 1 that suppresses thermal noise as well as generation of a dark current without decreasing the sensitivity.

Modifications (Modifications 1 to 3) of the above-described embodiment will be described below. The same components as those of the above-described embodiment will be provided with the same reference numerals as those thereof, and will not be described as appropriate.

2. Modification 1

Figure 4:
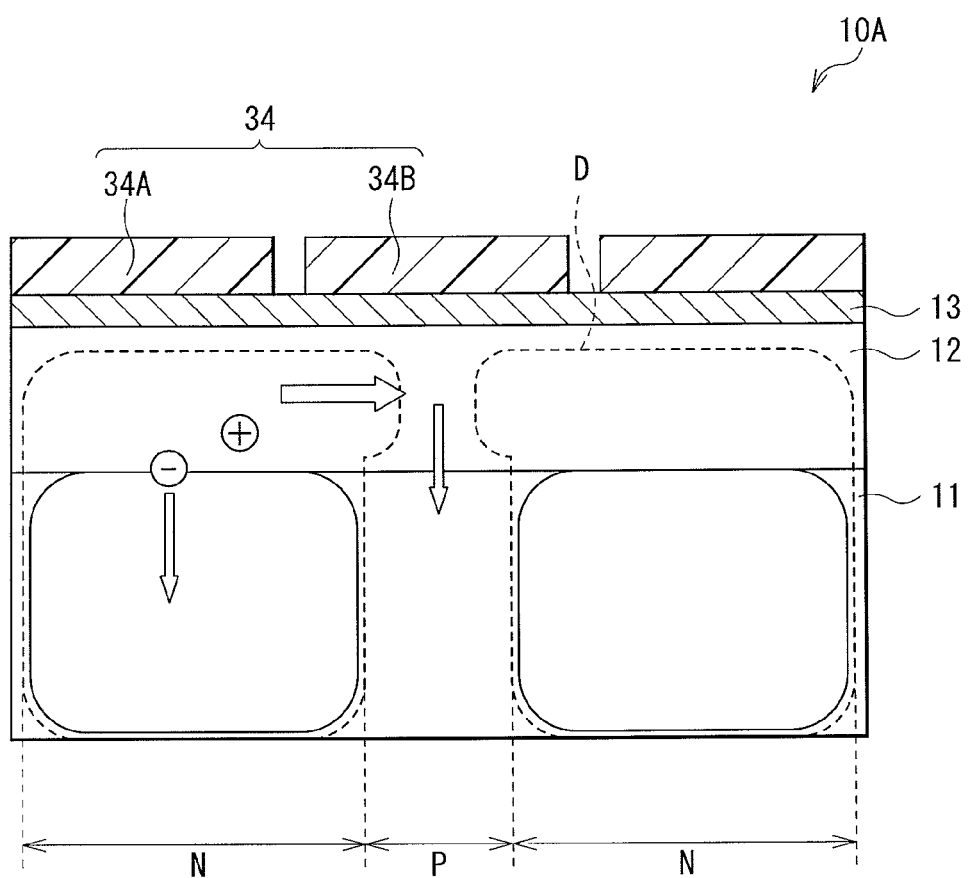
FIG. 4 is a cross-sectional diagram illustrating a configuration of an image pickup element according to Modification 1.

FIG. 4 illustrates a cross-sectional configuration of a main part of an image pickup element (an image pickup element 10A) according to Modification 1 of the above-described embodiment. In the image pickup element 10A, the insulating film 13 and a conductive film 34 are formed in this order on the photoelectric conversion film 12, and the conductive film 34 is divided between the photoelectric conversion region N and the ineffective region P. This is a point different from the above-described embodiment. Specifically, the conductive film 34 is divided between the photoelectric conversion section 12A and the ineffective section 12B of the photoelectric conversion film 12. Except this point, the image pickup element 10A has a configuration similar to the configuration of the image pickup element 10, and has similar functions and effects as well.

The conductive film 34 is formed of a transparent conductive material as with the above-described embodiment. The conductive film 34 includes a conductive film 34A (corresponding to a first region) provided on the photoelectric conversion section 12A of the photoelectric conversion film 12, and a conductive film 34B (corresponding to a second region) provided on the ineffective section 12B of the photoelectric conversion film 12. The conductive film 34A and the conductive film 34B are obtained by patterning a metal film to become the upper electrode, by photolithography and dry etching.

Figure 5:
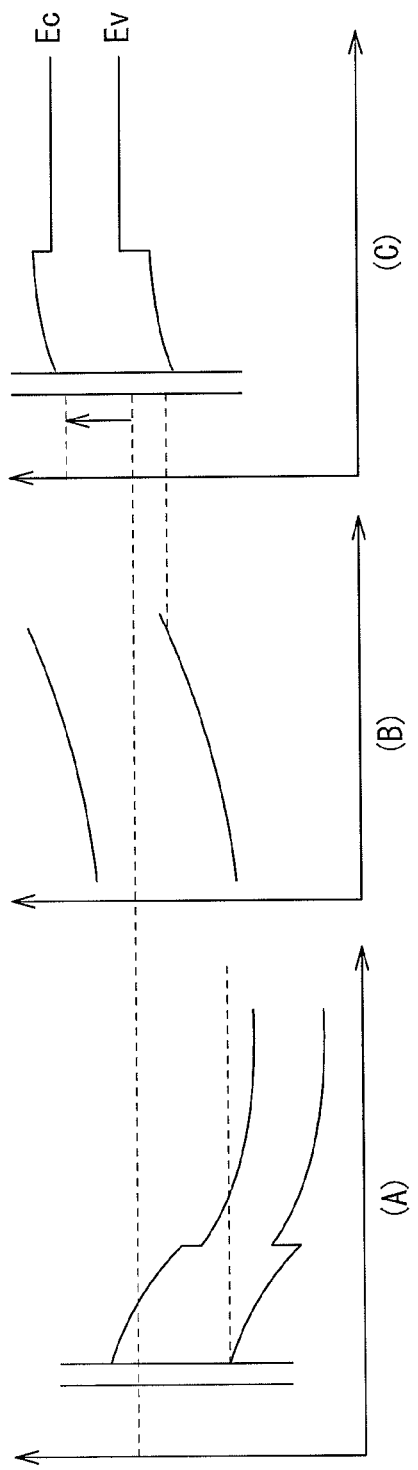
FIG. 5 is an energy band diagram in each region when a negative voltage is applied to the image pickup element illustrated in FIG. 4.

In this way, in the image pickup element 10A, the conductive film 34 is formed to be divided between the photoelectric conversion section 12A and the ineffective section 12B. Therefore, it is possible to apply voltages independent of each other to the photoelectric conversion region N and the ineffective region P, respectively. FIG. 5 is a characteristic diagram illustrating a change of an energy band in each of the photoelectric conversion region N (Part (A) of FIG. 5), the ineffective region P (Part (C) of FIG. 5), and a part between the photoelectric conversion region N and the ineffective region P (Part (B) of FIG. 5), when voltages independent of each other are applied to the conductive film 34A and the conductive film 34B, respectively. In the present modification, a bias is applied to the conductive film 34A so that the conduction band Ec of the photoelectric conversion section 12A is slanted towards the n-type region 11A, while a bias lower than the bias applied to the conductive film 34A is applied to the conductive film 34B. This allows an electron generated at a border between the ineffective section 12B and the photoelectric conversion section 12A to move to the photoelectric conversion section 12A easily. Further, although the conduction band Ec of the photoelectric conversion section 12A is low in the photoelectric conversion region N while being high in the ineffective region P, this electron wall between the pixels is controllable with the conductive film 34B.

When the photoelectric conversion film 12 is irradiated with light in this state, an electron generated by photoelectric conversion in the photoelectric conversion section 12A and the ineffective section 12B is transferred to the n-type region 11A of the semiconductor substrate 11 through the conduction band Ec of the photoelectric conversion section 12A depleted as illustrated in FIG. 4. On the other hand, a positive hole generated by the photoelectric conversion is stored in the ineffective section 12B through the valence band Ev of the photoelectric conversion section 12A as illustrated in FIG. 4. A surplus positive hole is discharged to the p-type region 11B of the semiconductor substrate 11.

As described above, in the present modification, the conductive film 34 is divided between the photoelectric conversion section 12A and the ineffective section 12B. Therefore, it is possible to apply voltages independent of each other to the photoelectric conversion section 12A and the ineffective section 12B, respectively. This makes it possible to control a width (an X-axis direction), in addition to the thickness (a Z-axis direction), of the depletion layer of the photoelectric conversion film 12. Therefore, it is possible to take a photoelectron into the semiconductor substrate 11 while suppressing generation of a dark current at the light-receiving surface S1. Hence, a positive hole is allowed to be discharged from the photoelectric conversion section 12A more rapidly.

3. Modification 2

Figure 6:
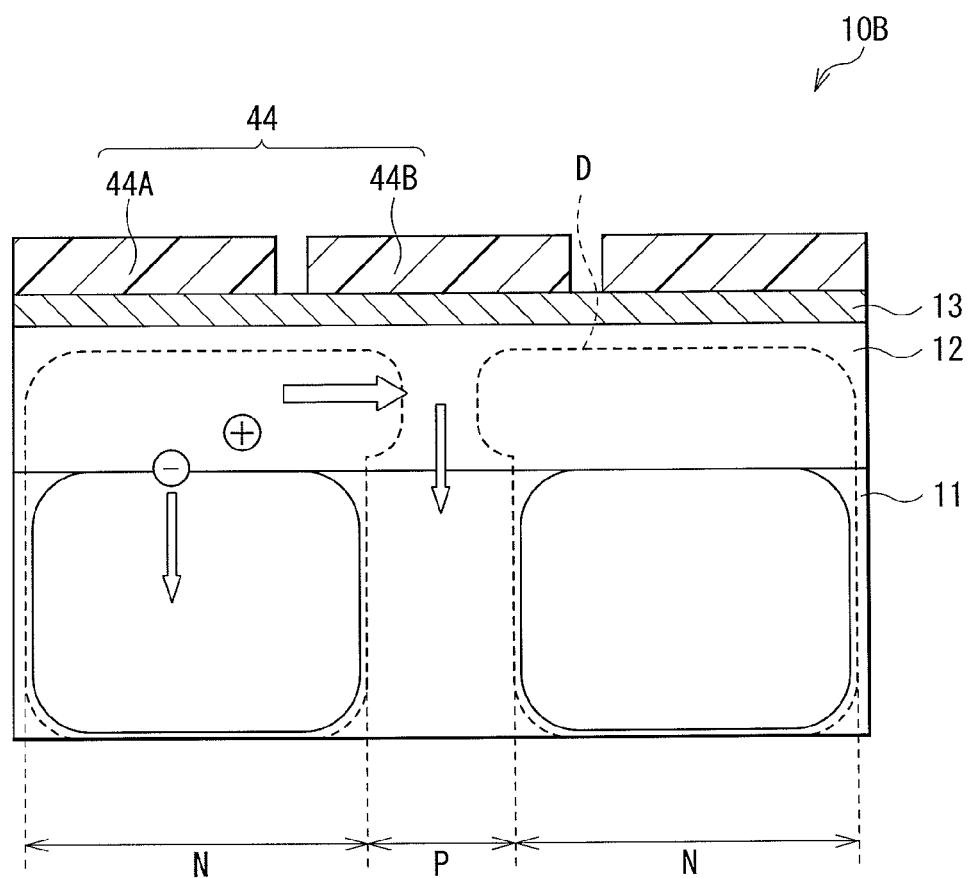
FIG. 6 is a cross-sectional diagram illustrating a configuration of an image pickup element according to Modification 2.

FIG. 6 illustrates a cross-sectional configuration of an image pickup element (an image pickup element 10B) according to Modification 2 of the above-described embodiment. In the image pickup element 10B, a conductive film 44A and a conductive film 44B spaced apart are formed on the insulating film 13, and the conductive film 44B formed on the ineffective section 12B is formed of a light-shielding material. This is a point different from the above-described embodiment. Except this point, the image pickup element 10A has a configuration similar to the configuration of the image pickup element 10, and has similar functions and effects as well.

As described above, in the image pickup element 10B, the conductive film 44B formed on the ineffective section 12B is formed of the light-shielding material. Therefore, in addition to the effects of the above-described embodiment and Modification 1, an effect of being able to prevent color mixture due to light obliquely entering an adjacent pixel is produced.

4. Modification 3

Figure 7:
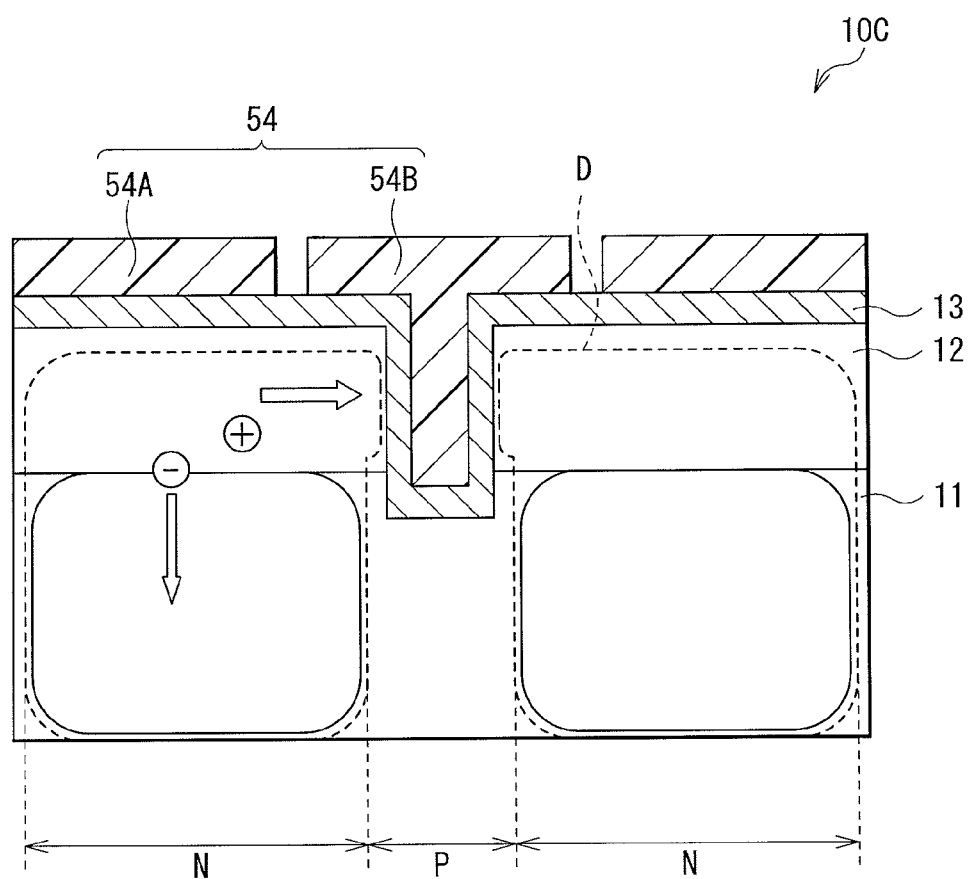
FIG. 7 is a cross-sectional diagram illustrating a configuration of an image pickup element according to Modification 3.

FIG. 7 illustrates a cross-sectional configuration of an image pickup element (an image pickup element 10C) according to Modification 3 of the above-described embodiment. In the image pickup element 10C, a conductive film 54A and a conductive film 54B spaced apart are formed on the insulating film 13. The conductive film 54B formed on the ineffective section 12B is formed of a light-shielding material, and a projection is formed in the ineffective section 12B of the photoelectric conversion film 12. This is a point different from the above-described embodiment.

As described above, in the image pickup element 10C, the conductive film 54B formed on the ineffective section 12B is formed of the light-shielding material, and the projection is formed in the ineffective section 12B. This allows the depletion layer D formed in the photoelectric conversion section 12A to be extended in a thickness direction. Therefore, besides the effects of the above-described embodiment and Modifications 1 and 2, easy transfer of an electron to the n-type region 11A and easy discharge of a positive hole to the p-type region 11B are achieved.

It is to be noted that the projection of the conductive film 54B may be preferably formed to pass through the photoelectric conversion film 12, and to have a tip extending to the semiconductor substrate 11. As a result, the photoelectric conversion film 12 is divided between the pixels. This makes it possible to prevent an electron from moving to an adjacent pixel. Further, a region (for example, in proximity to the conductive film 54B) where the valence band Ev is highest in the ineffective section 12B is in contact with the p-type region 11B. Therefore, a positive hole is discharged to the p-type region 11B easily.

5. Application Example

Figure 8:
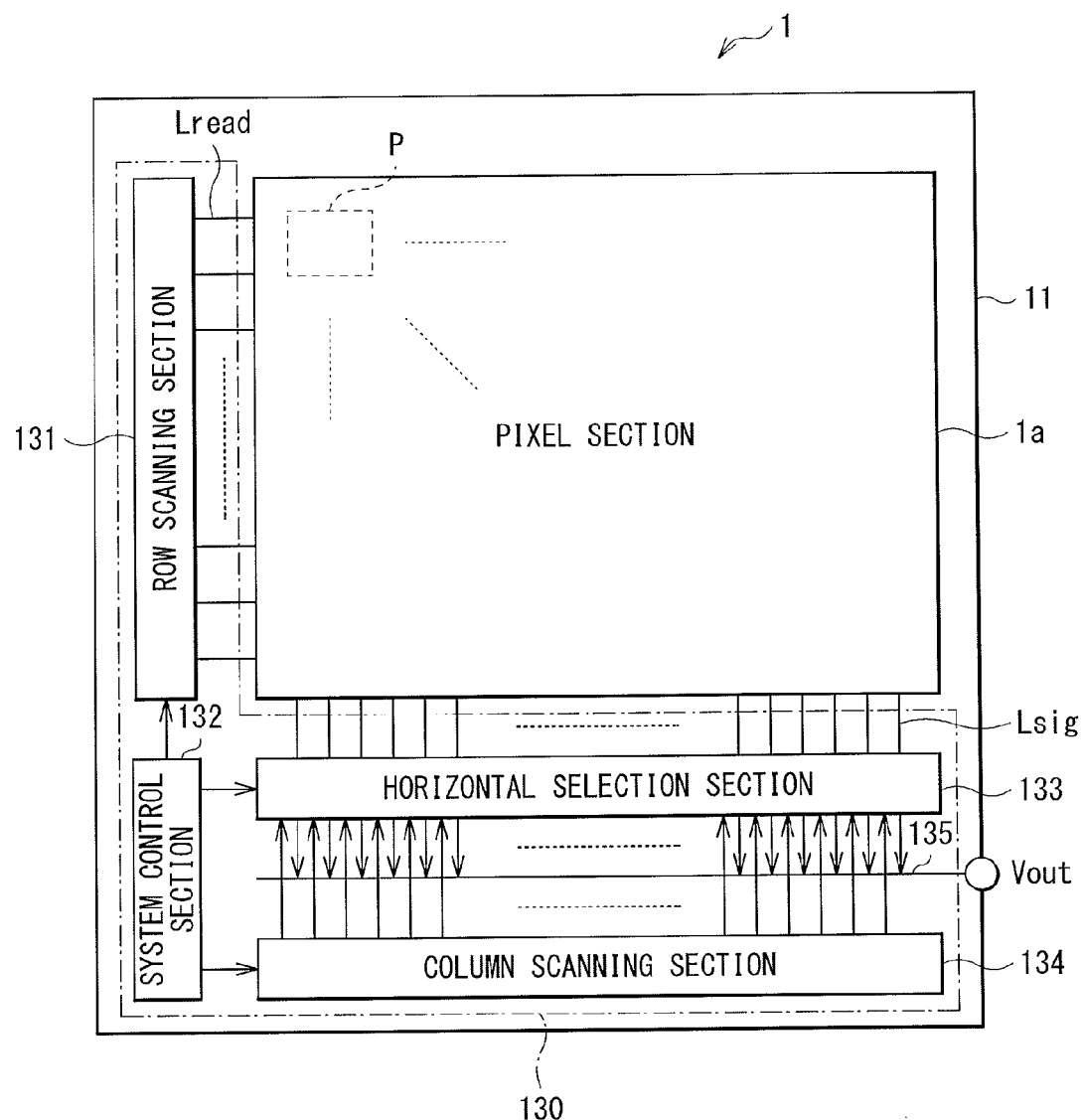
FIG. 8 is a schematic diagram illustrating an overall configuration of an image pickup device using the image pickup element illustrated in FIG. 1.

FIG. 8 illustrates an overall configuration of a solid-state image pickup device (an image pickup device 1) in which any of the image pickup elements (the image pickup elements 10, 10A, 10B, and 10C) of the above-described embodiment and Modifications 1 to 3 is used for each pixel. The image pickup device 1 is a CMOS image sensor, and includes the pixel section 1a serving as an image pickup area, in a central part on the semiconductor substrate 11. In a peripheral region of the pixel section 1a, for example, a peripheral circuit section 130 including a row scanning section 131, a system control section 132, a horizontal selection section 133, and a column scanning section 134 may be provided.

The pixel section 1a may include, for example, a plurality of unit pixels P (each equivalent to the image pickup element 10, 10A, 10B, or 10C) is two-dimensionally arranged in rows and columns. To the unit pixel P, for example, a pixel driving line Lread (specifically, a row selecting line and a reset control line) may be wired for each pixel row, and the vertical signal line Lsig may be wired for each pixel column. The pixel driving line Lread transmits a drive signal for signal reading from a pixel, and has one end connected to an output terminal of the row scanning section 131, the output terminal corresponding to each row.

The row scanning section 131 includes components such as a shift register and an address decoder. The row scanning section 131 may be, for example, a pixel driving section that drives the pixels P of the pixel section 1a row by row. A signal outputted from each of the pixels P in the pixel row selected by the row scanning section 131 is supplied to the horizontal selection section 133 through each of the vertical signal lines Lsig. The horizontal selection section 133 may be configured of, for example, components such as an amplifier and a horizontal selection switch provided for each of the vertical signal lines Lsig.

The column scanning section 134 includes components such as a shift register and an address decoder, and drives the horizontal selection switches of the horizontal selection section 133 while sequentially scanning these horizontal selection switches. By this selective scanning of the column scanning section 134, a signal of each of the pixels P transmitted through each of the vertical signal lines Lsig is sequentially outputted to a horizontal signal line 135, and then transmitted to the outside of the semiconductor substrate 11 through the horizontal signal line 135.

A circuit portion including the row scanning section 131, the horizontal selection section 133, the column scanning section 134, and the horizontal signal line 135 may be directly formed on the semiconductor substrate 11, or may be disposed in an external control IC. It is possible to provide this circuit portion in other substrate connected by a cable or the like.

The system control section 132 receives a clock provided from outside the semiconductor substrate 11 as well as data commanding an operation mode, and outputs inside information of the image pickup device 1. In addition, the system control section 132 may include, for example, a timing generator that generates various timing signals. The system control section 132 may control driving of the peripheral circuits such as the row scanning section 131, the horizontal selection section 133, and the column scanning section 134, based on the various timing signals generated by the timing generator.

Figure 9:
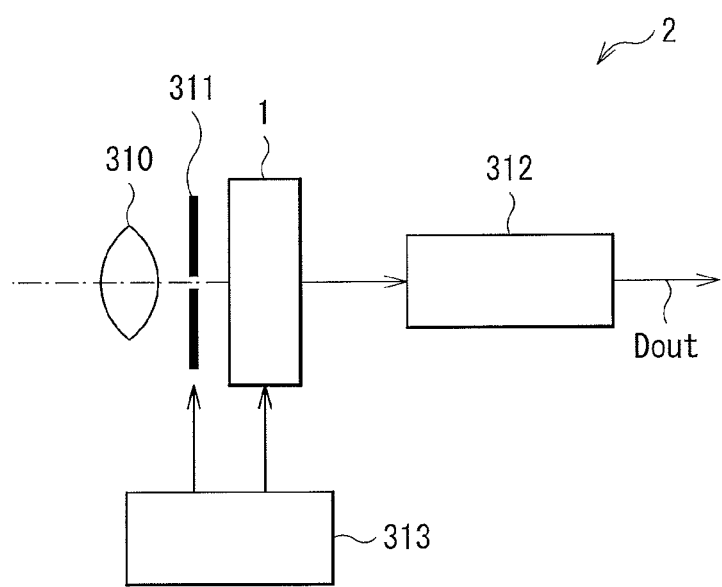
FIG. 9 is a diagram illustrating a schematic configuration of an electronic apparatus to which the image pickup device illustrated in FIG. 8 is applied.

The image pickup device 1 as described above is applicable to all types of electronic apparatuses having an image pickup function. Examples of the electronic apparatuses may include camera systems such as digital still cameras and video cameras, as well as mobile phones. As an example, FIG. 9 illustrates a schematic configuration of a camera (an electronic apparatus 2). The electronic apparatus 2 may be, for example, a video camera capable of shooting a still image or a moving image. The electronic apparatus 2 may include the image pickup device 1, an optical system (an optical lens) 310, a shutter unit 311, a signal processing section 312, and a drive section 313.

The optical system 310 guides image light (incident light) from a subject to the pixel section 1*a* of the image pickup device 1. The optical system 310 may include a plurality of optical lenses. The shutter unit 311 controls an optical irradiation period and a shielding period for the image pickup device 1. The drive section 313 controls shutter operation of the shutter unit 311 and transfer operation of the image pickup device 1. The signal processing section 312 performs various kinds of signal processing on a signal outputted from the image pickup device 1. For example, an image signal Dout after the signal processing may be stored in a storage medium such as a memory, or outputted to a unit such as a monitor.

The present technology has been described above with reference to the embodiment and Modifications 1 to 3, but is limited thereto and may be variously modified. For example, it is not necessary to provide all the components of the above-described embodiment and the like, and other component may be further provided.

Further, in the above-described embodiment and the like, the configurations of the image pickup elements 10, 10A, 10B, and 10C of the backside illumination type have been each taken as an example. However, the present technology is applicable to a surface irradiation type.

Furthermore, in the above-described embodiment and the like, the configuration in which the light of each color (R, G, B, and W) is selectively received in a direction along an image pickup surface has been described, but this is not limitative. For example, a so-called stack-type configuration may be adopted. In the stack-type configuration, photoelectric conversion sections for the respective colors are laminated in a depth direction perpendicular to the image pickup surface.

It is possible to achieve at least the following configurations from the above-described example embodiments of the disclosure.

(1) An image pickup element including:
a photoelectric conversion film provided on a semiconductor substrate and including a chalcopyrite-based compound;
an insulating film provided on a light incident surface side of the photoelectric conversion film; and
a conductive film provided on the insulating film.
(2) The image pickup element according to (1), further including a first pixel and a second pixel adjacent to each other,
wherein the photoelectric conversion film includes a photoelectric conversion section and an ineffective section, the photoelectric conversion section being provided at a position corresponding to each of the first pixel and the second pixel, and the ineffective section being provided between the first pixel and the second pixel.
(3) The image pickup element according to (2), wherein the conductive film has a first region corresponding to the photoelectric conversion section and a second region corresponding to the ineffective section, and the second region is spaced away from the first region.
(4) The image pickup element according (3), wherein in the conductive film, the first region has optical transparency and the second region has light blocking characteristics.
(5) The image pickup element according to (3) or (4), wherein the second region of the conductive film has a projection in the ineffective section of the photoelectric conversion film.
(6) The image pickup element according to (5), wherein the projection passes through the photoelectric conversion film, and extends to the semiconductor substrate.
(7) The image pickup element according to any one of (3) to (6), wherein a bias lower than a bias applied to the first region is applied to the second region of the conductive film.
(8) An image pickup device provided with an image pickup element, the element including:
a photoelectric conversion film provided on a semiconductor substrate and including a chalcopyrite-based compound;
an insulating film provided on a light incident surface side of the photoelectric conversion film; and
a conductive film provided on the insulating film.

It should be understood by those skilled in the art that various modifications, combinations, sub-combinations, and alterations may occur depending on design requirements and other factors insofar as they are within the scope of the appended claims or the equivalents thereof.

What is claimed is:
1. An image pickup element comprising:
a photoelectric conversion film on a semiconductor substrate, the photoelectric conversion film including a chalcopyrite-based compound;
an insulating film on a light incident surface side of the photoelectric conversion film, the insulating film comprising a silicon-containing compound;
a conductive film on the insulating film; and a MOS transistor in the semiconductor substrate, a source of the MOS transistor being a first charge accumulating well region adjacent the photoelectric conversion film, a drain of the MOS transistor being a floating diffusion in a second charge accumulating well region adjacent the first well region and the photoelectric conversion film, the first and second well regions being of opposite conductivity types.

2. The image pickup element according to claim 1, further comprising a first pixel and a second pixel adjacent to each other, wherein the photoelectric conversion film includes a photoelectric conversion section and an ineffective section, the photoelectric conversion section being provided at a position corresponding to each of the first pixel and the second pixel, and the ineffective section being provided between the first pixel and the second pixel.

3. The image pickup element according to claim 2, wherein the conductive film has a first region corresponding to the photoelectric conversion section and a second region corresponding to the ineffective section, and the second region is spaced away from the first region.

4. The image pickup element according to claim 3, wherein in the conductive film, the first region has optical transparency and the second region has light blocking characteristics.

5. The image pickup element according to claim 3, wherein the second region of the conductive film has a projection in the ineffective section of the photoelectric conversion film.

6. The image pickup element according to claim 5, wherein the projection passes through the photoelectric conversion film, and extends to the semiconductor substrate.

7. The image pickup element according to claim 3, wherein a bias lower than a bias applied to the first region is applied to the second region of the conductive film.

8. The image pickup element of claim 1, wherein the insulating film comprises a silicon nitride layer, a silicon oxide layer, silicon oxynitride layer or a lamination including any of them.

9. An image pickup device with an image pickup element, the image pickup element comprising:
   a photoelectric conversion film on a semiconductor substrate, the photoelectric conversion film including a chalcopyrite-based compound;
   an insulating film on a light incident surface side of the photoelectric conversion film, the insulating film comprising a silicon-containing compound;
   a conductive film on the insulating film; and
   a MOS transistor in the semiconductor substrate, a source of the MOS transistor being a first charge accumulating well region adjacent the photoelectric conversion film, a drain of the MOS transistor being a floating diffusion in a second charge accumulating well region adjacent the first well region and the photoelectric conversion film, the first and second well regions being of opposite conductivity types.

10. The image pickup element of claim 8, wherein the insulating film has a thickness of 5 nm to 500 nm, both inclusive.

11. The image pickup device of claim 9, wherein the insulating film comprises a silicon nitride layer, a silicon oxide layer, silicon oxynitride layer or a lamination including any of them.

12. The image pickup device of claim 11, wherein the insulating film has a thickness of 5 nm to 500 nm, both inclusive.

* * * * *